United States Patent
Stanley

(10) Patent No.: US 6,204,657 B1
(45) Date of Patent: Mar. 20, 2001

(54) TEMPERATURE COMPENSATED CLOSED-LOOP HALL EFFECT CURRENT TRANSFORMER

(75) Inventor: Gerald R. Stanley, Osceola, IN (US)

(73) Assignee: Crown Audio, Inc., Elkhart, IN (US)

( * ) Notice: Subject to any disclaimer, the term of this patent is extended or adjusted under 35 U.S.C. 154(b) by 0 days.

(21) Appl. No.: 09/154,235

(22) Filed: Sep. 16, 1998

(51) Int. Cl.[7] .................................................. G01R 33/00

(52) U.S. Cl. .................. 324/117 H; 324/225; 338/32 H; 327/511

(58) Field of Search .............................. 324/117 H, 251, 324/225, 105; 338/32 H; 323/368, 294; 327/511

(56) References Cited

U.S. PATENT DOCUMENTS 3,573,616 * 4/1971 Kahen ............................... 324/117 H
5,818,225 * 10/1998 Miekley et al. ..................... 324/225

* cited by examiner

*Primary Examiner*—Walter E. Snow
(74) *Attorney, Agent, or Firm*—Baker & Daniels

(57) ABSTRACT

A closed loop Hall effect current transformer in which the Hall effect device has an input resistance which varies with its operating temperature. The Hall effect device is driven by a fixed voltage passing through a current limiting a resistor with variations in voltage across the resistor being indicative of the operating temperature of the device. Further, variations in the input resistance of the device caused by variations in its operating temperature is corrected for by mixing a correcting signal with the outputted signal from the device, said correcting signal being derived from a voltage signal taken across the resistor at the driving input of the device.

14 Claims, 1 Drawing Sheet

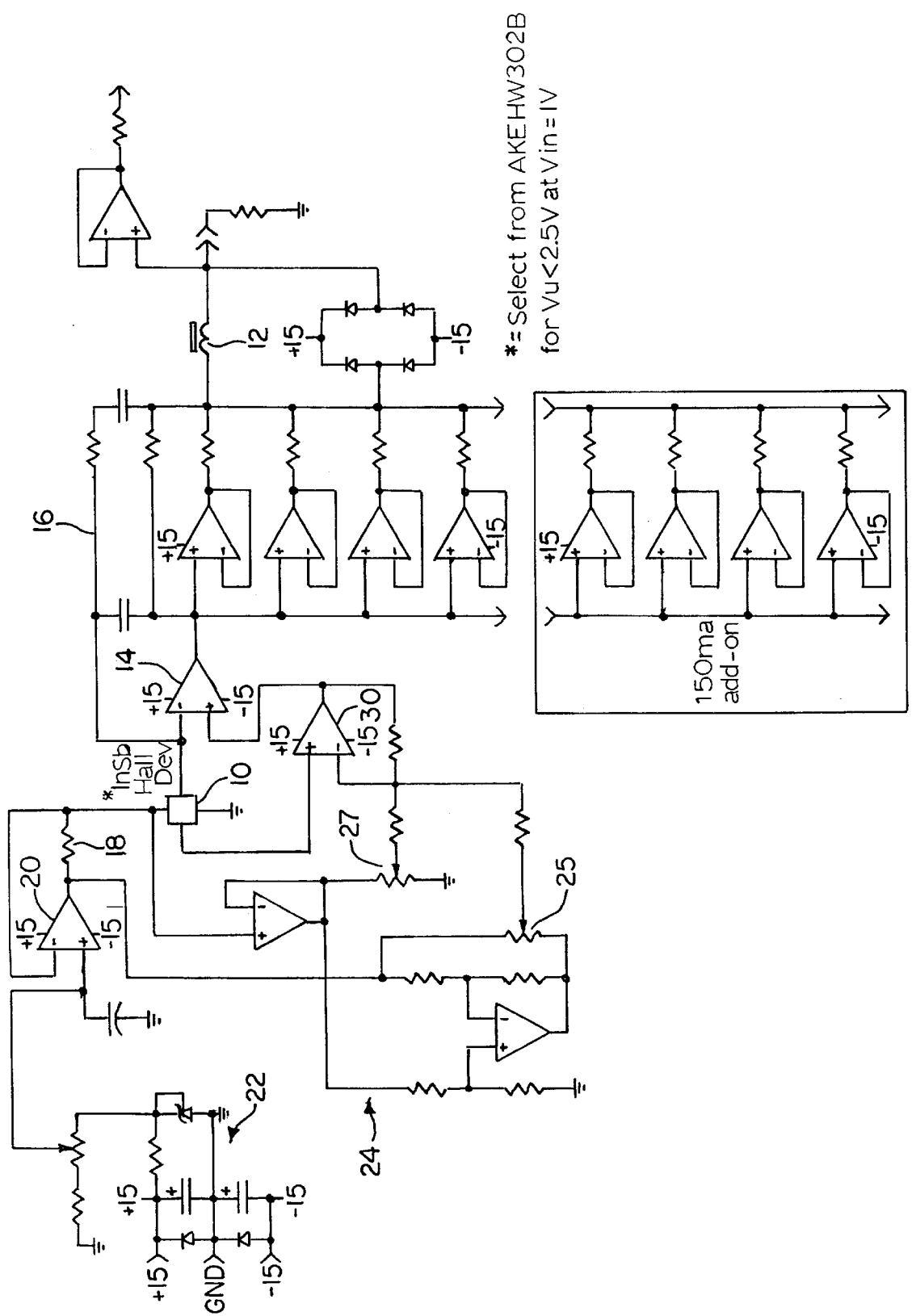

TEMPERATURE COMPENSATED CLOSED-LOOP HALL EFFECT CURRENT TRANSFORMER

BACKGROUND OF THE INVENTION

Closed-loop Hall effect current transformers (CT) have been used and known for several years. For example, see U.S. Pat. No. 3,573,616, incorporated herein by reference. An excellent type of such closed loop CT is one with a good signal to noise ratio, in other words having a high signal output. Such a CT device can be made with indium antimony (InSb), but indium antimony is characterized by having poor linearity and a very strong negative temperature coefficient regarding its main terminal resistance.

SUMMARY OF THE INVENTION

This invention relates to a closed loop Hall effect CT and will have specific but not limited application to such a CT made with indium antimony.

CT devices with strong temperature coefficients of resistance are preferably driven from voltage sources if the voltage offset as compared to temperature can be minimized. Also, with a negative temperature coefficient, there is a risk of thermal runaway as the input power to the CT increases with temperature and the drive voltage is held constant. Thus it is necessary to limit the peak current which can be delivered to the CT device. In this invention a resistor is placed in series with a regulating amplifier which provides the drive voltage to the Hall effect device. The resistor is selected such that the amplifier will saturate before destructive current can be delivered to the Hall effect device. Observing the voltage drop across the resistor, the current drawn by the Hall effect device and thus its temperature can be monitored.

In a formulation and construction of Hall devices, there are small errors in both symmetry and homogeneity. These errors, while slight, will nevertheless cause drift with the resulting operational sequence controlled by the CT being in error. In this invention, a small fraction of the temperature signal across the series placed resistor associated with the regulating amplifier is mixed with the DC output signal from the Hall effect device so as to null the effect of the temperature dependent error signal in the device.

It is an object of this invention to provide a closed loop Hall effect CT having a high signal to noise ratio in which the operating temperature of the Hall effect device can be monitored without the need of an external temperature sensor.

It is another object of this invention to provide a closed loop Hall effect CT in which the offset of the drive voltage to the device caused by variations in temperature of the device can be substantially eliminated.

Other objects of this invention will become apparent upon a reading of the following description.

DESCRIPTION OF THE DRAWINGS

A preferred embodiment of the invention has been chosen wherein:

FIG. 1 is a schematic circuit diagram of the invention.

DESCRIPTION OF THE PREFERRED EMBODIMENT

The preferred embodiment illustrated is not intended to be exhaustive or to limit the invention to the precise form disclosed. It is chosen and describe in order to best explain the invention and to enable others skilled in the art to utilize the invention.

The closed loop circuit shown in FIG. 1 as it relates to the current transformer or transducer includes a Hall effect device 10. Hall effect device 10 is shown to be made from indium antimony and is magnetically coupled and positioned within the gap of an magnetic conduction core 12 wherein the device will produce an output voltage proportional to the flux density created within the core gap by an outside current source. Device 10 and core 12 are shown in FIG. 1 in a spaced relationship for the ease of illustration of the circuit components. The flux induced voltage output of device 10 passes through amplifier 14 into a power stage 16 of banked amplifiers acting as a current buffer connected to the windings about core 12. The feedback current through core 12 nulls the flux within the core gap and is appropriately measured to arrive at the sensed conductor current.

The invention thus far described in this description is essentially of standard form and operation for closed loop transformers. A constant voltage, preferably about two volts, is applied across a series connected resistor 18 and forced upon device 10. This fixed voltage is produced by operational amplifier 20 as provided by its bias adjustment circuit 22. During, the operation of device 10, its operating temperature increases causing by the nature of the materials from which the device is formed, the input resistance of the device to vary. As such, in order to maintain a constant driving voltage on device 10 the input current to the device must change. The changes in current drawn by device 10 can be monitored by observing the changes in voltage across resistor 18 thus enabling one to discern the temperature of the device. Resistor 18 serves as a current limiter to prevent run-away in the case of a strong negative temperature coefficient with the resistance of the resistor being selected so as to cause amplifier 20 to saturate before a destructive current can be delivered to device 10.

Due to inherent manufacturing and material imperfections in device 10 errors in symmetry and homogeneity are created which produce small changes in residual voltage of the device. This change or offset in residual voltage which is random in magnitude and polarity can be compensated for by a signal that is proportional to the device's temperature. A differential amplifier circuit 24 is provided in which a signal which is voltage dependent upon temperature is taken across resistor 18, adjusted by panning potentiometer 25 and inverted within circuit 24. This inverted signal is mixed at an off-set amplifier 30 with a fixed non-temperature dependent offset voltage set by panning potentiometer 27. Amplifier 30 feeds the mixed corrected signal to amplifier 14 where it is combined with the output from device 10 to null the error induced by changes in the drive's input resistance.

The invention is not to be limited to the details above given but may be modified in accordance with the following general claims.

What is claimed is:

1. In a closed loop Hall effect current transformer comprising a magnetic core having an air gap and being adapted to surround a conductor which produces a magnetic flux in said gap upon current flow through the conductor, a Hall effect device located in said core air gap, an operational amplifier connected to said device to receive a voltage signal from the device induced by said magnetic flux in said gap, a conductive winding about said core connected to said amplifier to receive a current produced by the amplifier in response to said voltage signal, said current serving to drive said voltage signal to zero, said device having an operating temperature coefficient, a regulating amplifier for applying a fixed voltage to said device, a resistor between said regulating amplifier and said device wherein the voltage across said resistor during operation of said device serves as a means for indicating the operating temperature of said device.

2. The current transformer of claim 1 wherein said device has an input resistance which varies as said operating temperature varies, means for inputting a voltage signal correlating to said operating temperature into said operational amplifier to compensate for said variations in input resistance.

3. The current transformer of claim 2 wherein said device is formed of indium antimony in which said input resistance decreases as said operating temperature of device increases.

4. The current transformer of claim 2 wherein said means for inputting a voltage signal obtains its said signal across said resistor.

5. The current transformer of claim 4 wherein said means for inputting said voltage signal is a differential amplifier circuit for providing said voltage signal inputted into said operational amplifier.

6. The current transformer of claim 5 and means combined with said differential amplifier circuit for providing a fixed non-temperature dependent voltage signal to accommodate the static offset of said device which is mixed with said differential amplifier voltage signal and inputted into said operational amplifier.

7. A closed-loop current transformer including:
   a core forming a gap and an opening for receiving a conductor, the conductor producing flux across the gap when current passes through the conductor;
   a winding extending around the core;
   a Hall effect device located in the gap and outputting a first signal proportional to the flux;
   a first amplifier receiving the first signal and outputting a second signal to the winding to reduce the first signal;
   a second amplifier outputting a fixed voltage to the device; and
   a resistor connected between the second amplifier and the device, the voltage across the resistor indicating the temperature of the device.

8. The current transformer of claim 7 wherein the device has an input resistance that varies with the temperature.

9. The current transformer of claim 8 wherein the input resistance decreases with increases in the temperature.

10. The current transformer of claim 8 wherein the second amplifier outputs a current that varies with variations in the input resistance of the device, thereby maintaining the fixed voltage to the device.

11. The current transformer of claim 8 wherein the value of the resistor is selected to cause the second amplifier to saturate before the current damages the device.

12. The current transformer of claim 7 further including a differential amplifier circuit connected between the resistor and the first amplifier, the differential amplifier circuit generating a third signal based on the voltage across the resistor and providing the third signal to the first amplifier to compensate for an error in the first signal resulting from the temperature of the device.

13. The current transformer of claim 12 wherein the device has an input resistance that varies with the temperature, the variations in input resistance causing the error in the first signal.

14. The current transformer of claim 12 wherein the third signal is adjustable.

* * * * *